United States Patent [19]

Vaudel

[11] Patent Number: 5,362,228
[45] Date of Patent: Nov. 8, 1994

[54] APPARATUS FOR PREHEATING A FLOW OF GAS IN AN INSTALLATION FOR CHEMICAL VAPOR INFILTRATION, AND A DENSIFICATION METHOD USING THE APPARATUS

[75] Inventor: Serge Vaudel, Teuillac, France

[73] Assignee: Societe Europeenne de Propulsion, Suresnes, France

[21] Appl. No.: 967,817

[22] Filed: Oct. 28, 1992

[30] Foreign Application Priority Data

Nov. 4, 1991 [FR] France .................. 91 13583

[51] Int. Cl.⁵ .................................. F27B 9/00
[52] U.S. Cl. ........................ 432/120; 122/34
[58] Field of Search ............ 122/34, 492; 432/121, 432/120

[56] References Cited

U.S. PATENT DOCUMENTS

| 630,023 | 8/1899 | Baker | 122/492 |
| 3,250,322 | 5/1966 | McCrary, Jr. | 165/133 |
| 3,325,374 | 6/1967 | Margen | 122/34 |
| 4,629,481 | 12/1986 | Echols | 122/34 |
| 4,714,055 | 12/1987 | Sundheimer | 122/34 |

FOREIGN PATENT DOCUMENTS

| 60-149780 | 12/1985 | Japan . |
| 791664 | 3/1958 | United Kingdom . |
| 8704733 | 8/1987 | WIPO . |
| 9114798 | 10/1991 | WIPO . |

OTHER PUBLICATIONS

IBM Technical Disclosure Bulletin, vol. 27, No. 2, Jul. 1984, pp. 937–038, M. J. Cashin et al., "Cylindrical Gas Diffuser".

Primary Examiner—Henry C. Yuen
Attorney, Agent, or Firm—Weingarten, Schurgin, Gagnebin & Hayes

[57] ABSTRACT

The gas is preheated by means of at least one screen disposed transversely relative to the flow of gas penetrating into the enclosure. The screen is provided with passages for the flow of gas and is fixed inside a peripheral wall to define a channel to enable the gas to flow through the preheating apparatus, it is also provided with fins which project from its surface, the screen and the fins being made of a refractory sheet material, in particular a sheet of laminated graphite.

7 Claims, 2 Drawing Sheets

APPARATUS FOR PREHEATING A FLOW OF GAS IN AN INSTALLATION FOR CHEMICAL VAPOR INFILTRATION, AND A DENSIFICATION METHOD USING THE APPARATUS

The present invention relates to installations for chemical vapor infiltration, and more particularly to apparatus for preheating the gases used in such installations.

BACKGROUND OF THE INVENTION

Chemical vapor infiltration is a method used, in particular, in the fabrication of composite materials, and in particular composite materials having a matrix of carbon or of a ceramic. A fiber reinforcing substrate or "preform" having substantially the same shape as a composite material part to be fabricated is placed inside an enclosure. The substrate is densified by progressively filling its pores by injecting a flow of gas into the enclosure. Under determined conditions of temperature and pressure existing inside the enclosure, a solid deposit of matrix material is formed on the fibers of the substrate, right into the core of the substrate, by one of the components of the gas decomposing or by a reaction taking place between components of the gas in contact with the fibers. Chemical vapor infiltration is continued until a desired degree of substrate densification by the matrix is achieved.

Chemical vapor infiltration techniques for densifying a fiber substrate with a carbon matrix or with a ceramic matrix are well known. A carbon matrix is generally obtained by cracking alkanes, in particular methane or mixtures of methane and heavier alkanes. Chemical vapor infiltration of refractory materials other than carbon is described in Document FR-A-2 401 888. For example, a silicon carbide matrix can be obtained by decomposing methyltrichlorosilane (MTS) $CH_3SiCl_3$ in the presence of hydrogen $H_2$.

In order to form a deposit of the desired nature (composition and crystal structure) on the surface of the substrate fibers, it is necessary for the gas to be at the required temperature when it comes in contact with the substrate. Otherwise, undesirable secondary species may be deposited. Thus, in the above-outlined example of a silicon carbide matrix being formed by decomposing MTS, gas at too low a temperature can cause a deposit of silicon to be formed.

That is why proposals have already been made to bring the gas into contact with a preheater apparatus prior to diffusing it into the substrate. Thus, in the installation described in document FR-A-2 594 119, the flow of gas that penetrates into the enclosure comes initially into contact with superposed and perforated preheating plates. Since the preheating plates are inside the enclosure, they are permanently at the inside temperature of the enclosure, which temperature is determined to provide optimum infiltration conditions. The gas flow is thus raised to the desired temperature while it is passing through the preheating plates and prior to coming into contact with the substrates to be densified. The preheater plates also have the function of trapping parasitic deposits since these deposits tend to form on the surfaces first encountered by the gas flow on penetrating into the enclosure.

However, the preheating plates of that prior installation are made of graphite, and are therefore heavy and bulky. Because of the considerable mass of those plates, the time taken to heat the enclosure and to stabilize its internal temperature to the desired value is increased. In addition, because of their bulk, the preheating plates significantly reduce the working volume inside the enclosure. However, it is necessary to obtain optimum filling of the inside of the enclosure with the substrates to be densified because of the very high cost of fabricating composite material pans by chemical vapor infiltration. This cost is the result, in particular, of the extremely long duration (generally several hundreds of hours) required by the infiltration process to achieve the desired degree of substrate densification.

In addition, it has been observed that varying degrees of densification within pans or between different parts densified simultaneously are obtained in composite material parts fabricated by means of an installation such as that described in above-mentioned document FR-A-2594 119. The densification gradient seems to be caused, at least in pan, by non-uniformity of the gas in the working volume of the enclosure and/or by non-optimum flow conditions for said gas. It is desirable for the densification gradient within a part made of composite material to be reduced to as small a value as possible so as to obtain a matrix with as little anisotropy as possible, thereby improving the properties of the composite material. When a plurality of parts are densified simultaneously, it is desirable to avoid too great a dispersion in the characteristics of the resulting composite materials.

An object of the invention is thus to provide improved preheating apparatus capable of preheating a flow of gas penetrating into an enclosure of an installation for chemical vapor infiltration.

More particularly, an object of the invention is to provide preheating apparatus which is less heavy and bulky than the graphite plates used in the prior art, and which provides gas that is more homogeneous throughout the working volume of the enclosure.

SUMMARY OF THE INVENTION

According to the invention, this object is achieved by apparatus for preheating the gas that penetrates into an enclosure of an installation for chemical vapor infiltration, the apparatus comprising at least one screen for placing substantially transversely relative to the flow of gas penetrating into the enclosure and provided with passages for the flow of gas, wherein the screen is fixed inside a peripheral wall defining a channel for the flow of gas through the preheating apparatus, and is provided with fins that project from its surface, the screen and the fins being made of refractory sheet material.

The use of at least one screen provided with fins makes it possible to offer a greater heat exchange area, and making them out of a refractory material in sheet form reduces mass and bulk.

Advantageously, the screen includes a deflector in the central portion thereof for the purpose of distributing the incident gas flow over the entire area of the screen fitted with fins. The preheating apparatus comprising the peripheral wall and the screen provided with fins together with a deflector then has a configuration approximately like that of a turbine.

Also advantageously, the fins are constituted by portions cut out from the screen to form the passages through the screen for the flow of gas.

A plurality of screens may be disposed above one another inside the peripheral wall, the passages formed through the screens not being in alignment with one another.

The sheet material constituting the screen and the fins is a sheet of laminated graphite, for example.

For the purpose of densifying substrates in the enclosure, the preheating apparatus may merely be placed at the top of the charge of substrates to be densified. The charge of substrates is generally disposed on a rotary support. Rotation of the charge carrying the preheating apparatus and the turbine-like configuration of the apparatus generate an effect whereby the gas flow is sucked through the preheating apparatus, thereby preventing any direct flow of gas through a gap between the periphery of the preheating apparatus and the inside wall of the enclosure.

BRIEF DESCRIPTION OF THE DRAWINGS

An embodiment of the invention is described by way of example with reference to the accompanying drawings, in which.

DETAILED DESCRIPTION

Figure 1:
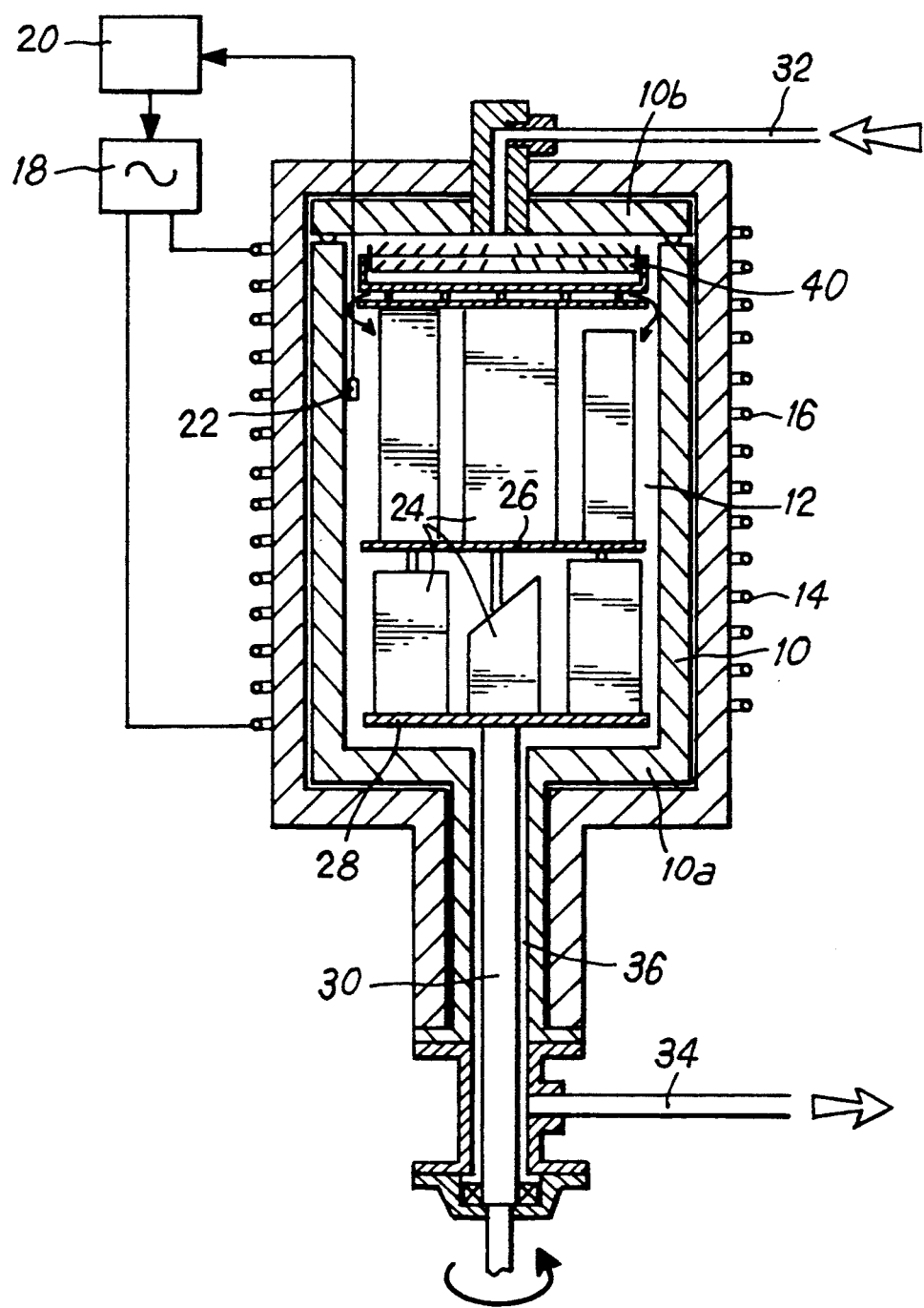
FIG. 1 is a highly diagrammatic section view through an installation for chemical vapor infiltration for use in densifying substrates in the fabrication of pans made of composite material.

The installation shown highly diagrammatically in FIG. 1 comprises a graphite induction member 10 delimiting an enclosure 12 which constitutes a reaction chamber. The induction member 10 is surrounded by a metal inductor 14 and a thermal insulator 16 is interposed between them. The inductor 14 is powered by a power supply 18. A regulation circuit 20 controls the power supply 18 as a function of a signal delivered by a temperature probe 22 placed inside the enclosure 12, thereby maintaining the temperature inside the enclosure at a desired value.

The induction member 10 constitutes a sealed structure having a vertical axis cylindrical portion closed at its bottom end by a bottom 10a and at its top end by a cover 10b. The induction member 10 may be placed inside a closed vessel (not shown), with the space between the induction member and the vessel being swept by an inert gas.

Inside the enclosure 12, substrates 24 to be densified (typically fiber preforms made of plies of cloth or sheets of threads or cables, or of felt, for example, and optionally held in tooling) are disposed on a charger 26 supported by a turntable 28. The turntable may rotate about a vertical axis coinciding with the axis of the induction member 10 and of the inductor 14. The turntable 28 is rotated by a motor (not shown) coupled to the turntable by a shaft 30 passing through the bottom 10a of the induction member.

The enclosure 12 is fed with the reactive gas by means of ducting 32 which terminates at the top of the enclosure, passing through the cover 10b. Gas is extracted from the enclosure 12 by means of ducting 34 connected to an annular passage 36 surrounding the shaft 30 and opening out into the bottom of the enclosure.

The installation outlined above is of known type, and as a result a more detailed description is unnecessary.

The reactive gas entering the enclosure 12 comes firstly into contact with preheating apparatus 40 placed at the top of the charge of substrates 24.

Figure 2:
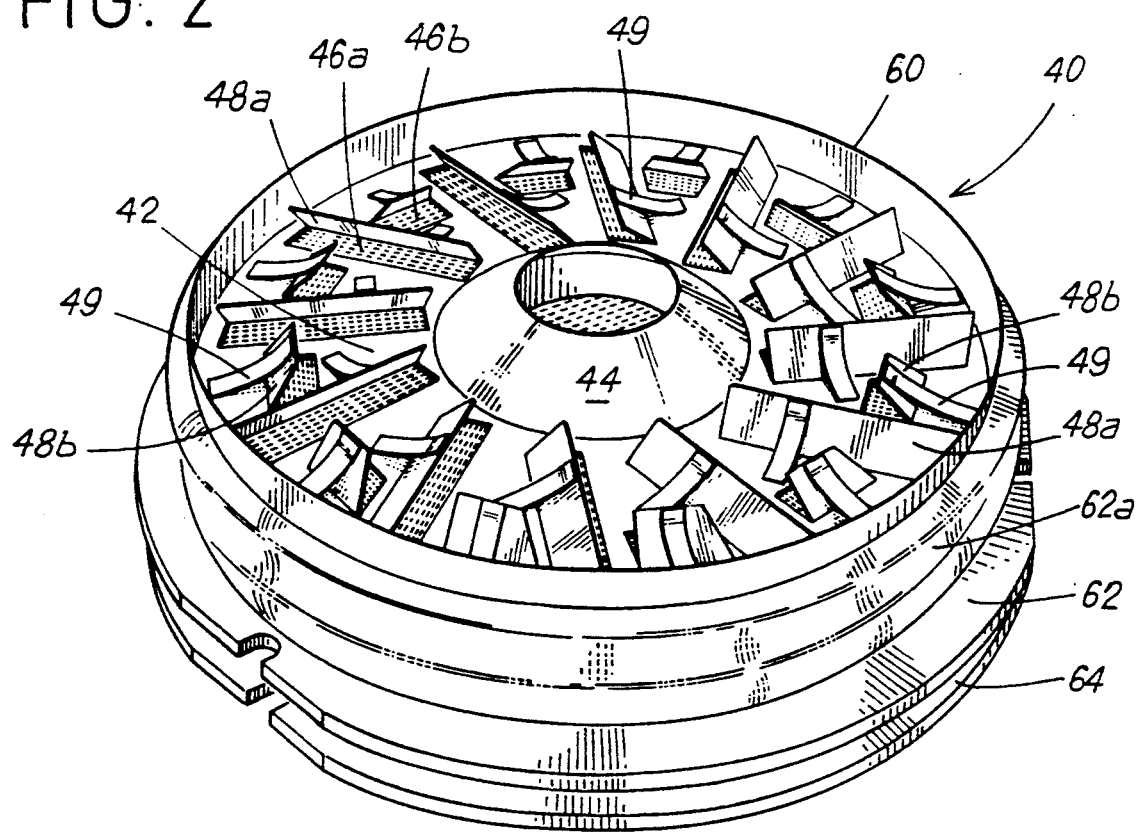
FIG. 2 is a detail view in perspective and on a larger scale showing preheating apparatus of the invention forming a part of the installation of FIG. 1.
Figure 3:
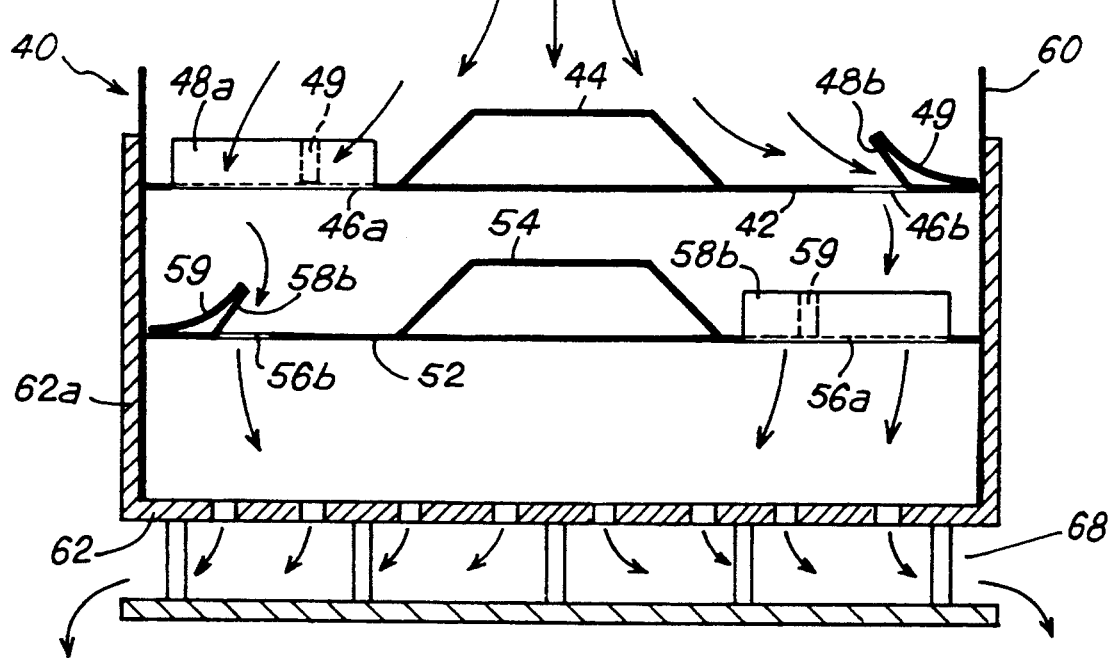
FIG. 3 is an elevation view in section through the preheating apparatus of FIG. 2.

The preheating apparatus 40 shown in greater detail in FIGS. 2 and 3 comprises two screens 42 and 52 in the form of disks fixed one above the other and spaced apart from each other within a peripheral wall forming a ring 60.

The screen 42 includes a frustoconical deflector 44 disposed at its center and facing the outlet into the enclosure from the ducting 32. The side wall of the deflector 44 deflects the incident flow of gas over the entire area of the screen 42 lying between the deflector and the ring 60. This area includes two series of orifices allowing the flow of gas to pass through the screen 42. A first series comprises orifices in the form of elongate slots 46a extending substantially radially, and a second series comprises openings 46b formed in the peripheral portion of the screen, each between two of the slots 46a.

The screen 42 also carries fins which project from its top surface, and which slope relative to the normal to said surface. In the example shown, the fins are constituted by the portions of the screen 48a and 48b that are cut out to form the slots 46a and the openings 46b. Cutting out is performed incompletely and each fin is obtained by folding the cut-out portion along one of its edges by which it remains attached to the remainder of the screen. The fins 48a and 48b may be held in their raised positions by means of corresponding tongues 49 each having one end stuck to the surface of the screen and another end stuck to a fin. Naturally, other configurations and dispositions could be adopted for the passages formed through the screen and for the fins formed on the screen. In addition, the fins could be constituted by pieces added onto the screen instead of by pieces cut out from the screen.

The function of the fins 48a and 48b is to increase the heat exchange area between the incident flow of gas and the preheating apparatus.

The material from which the screen 42, the deflector 44, the fins 48a and 48b, the tongues 49, if any, and the ring 60 are made is selected for its ability to withstand the temperatures used and for its inertness relative to the flow of reactive gas. In accordance with the invention it is constituted by refractory sheet material which also has the advantage of low weight and small bulk. It is possible, in particular, to use laminated graphite sheets such as those sold under the name "Sigraflex" by the German firm Sigri GmbH.

The screen 52 disposed beneath the screen 42 is analogous in configuration to the screen 42 having a central deflector 54 which may be smaller than the deflector 44, passages 56a and 56b for the gas flow and fins 58a and 58b held by tongues 59. The shapes of the passages and of the fins are not necessarily the same as for the screen 42. The screen 52 is mounted so as to avoid any axial alignment between the passages through the screen 42 and those through the screen 52, thereby forcing the gas flow to follow a path that is as long as possible through the preheating apparatus.

The assembly constituted by the screens 42 and 52 and the ring 60 is supported by a plate 62 in the form of a disk having an annular rim 62a in which the ring 60 is engaged. A second plate 64 in the form of a disk is disposed beneath the plate 62 and is spaced apart therefrom. The plates 62 and 64 are of substantially the same size and they are connected together by spacers 66. The plate 64 is solid whereas the plate 62 is provided with passages to allow the flow of gas that has passed through the screens 42 and 52 to reach the working volume of the enclosure 12 through the plate 62 and through the annular gap 68 between the plates 62 and 64, and at the periphery thereof.

Although the above description relates to preheating apparatus having two screens 42 and 52, it would naturally be possible to use a single screen or to use more than two screens.

To perform a densification cycle by means of the above-described installation, the substrates to be densified 24 are placed on the charger 26 which may comprise a plurality of adjustable-position support plates at different levels, for example. The preheating apparatus is merely placed on top of the charge, as close as possible to the outlet from the feed ducting 32. The reactive gas is admitted into the enclosure once the temperature inside the enclosure has stabilized to the required value, with the pressure inside the enclosure being brought to the desired value by pumping through the ducting 34.

The gas is raised to the required temperature by passing through the screens 42 and 52 inside the channel defined by the ring 60 of the preheating apparatus 40, and by coming into contact therewith, the apparatus also serving to pick up any deposit of undesirable species. The preheating apparatus 40 is rotated by the rotation of the turntable 28. This applies a suction effect through the preheating apparatus on the gas admitted into the enclosure, given the configuration of the apparatus whose screens with fins 42 and 52 and whose ring 60 are similar in configuration to a turbine. This suction effect prevents the gas passing directly through the gap that exists between the preheating apparatus 60 and the inside wall of the enclosure 12.

It may nevertheless be observed that the preheating apparatus could be fixed to the top portion of the enclosure, e.g. by being suspended beneath the cover 10b, instead of being placed on the substrates constituting the charge inside the enclosure.

The following table shows the advantages obtained by preheating apparatus B of the invention as shown in FIGS. 2 and 3 in comparison with preheating apparatus A constituted by prior art superposed graphite plates of the prior art, apparatuses A and B providing similar performance in preheating the flow of gas. The preheating apparatus of the invention provides a mass saving of more than 44% and a gain in the available height inside the enclosure of 8.6%. In addition, the cost of apparatus in accordance with the invention is better than ⅓ less than the cost of the prior art apparatus.

TABLE

|  | Preheating apparatus A (prior art) | Preheating apparatus B (invention) | Gain |
| --- | --- | --- | --- |
| Mass of preheating apparatus | 118.7 kg | 61.3 kg | −44.6% |
| Height of preheating apparatus | 320 mm | 210 mm | −34.4% |
| Height available inside enclosure | 1280 mm | 1390 mm | +8.6% |

I claim:

1. In an installation for chemical vapor infiltration comprising an enclosure, heating means for maintaining the temperature inside the enclosure at a desired value, and means for feeding said enclosure with reactive gas, an improvement in an apparatus for preheating the gas fed into said enclosure, comprising:
   (a) a peripheral wall defining a channel for the flow of gas penetrating into the enclosure and passing through the preheating apparatus; and
   (b) at least one screen fixed inside said peripheral wall and having a surface extending substantially transversely relative to said flow of gas, said screen being provided with passages for the flow of gas therethrough and with fins that project from its surface, said screen and said fins being made of a refractory sheet material and being at said desired temperature value, whereby the gas flowing through said channel and said screen is preheated by contacting said screen and said fins.

2. A preheating apparatus as claimed in claim 1, wherein said screen is provided with a deflector in its central portion for distributing the incoming gas flow over the entire surface of the screen fitted with said fins.

3. A preheating apparatus as claimed in claim 1, wherein said fins are constituted by portions cut out from said screen to form said passages for the flow of gas.

4. A preheating apparatus as claimed in claim 1, wherein a plurality of screens are located above one another inside said peripheral wall, the passages formed through two adjacent screens of said plurality of screens being misaligned with respect to each of said two adjacent screens.

5. A preheating apparatus as claimed in claim 1, wherein the sheet material constituting the screen and the fins comprises laminated graphite.

6. In an installation for densifying porous substrates by chemical vapor infiltration comprising an enclosure, heating means for maintaining the temperature inside the enclosure at a desired value, support means for supporting said substrates inside the enclosure, and means for feeding said enclosure with reactive gas at an upper zone thereof, an improvement in an apparatus for preheating the gas fed into said enclosure, comprising:
   (a) a peripheral wall defining a channel for the flow of gas penetrating into the enclosure and passing through the preheating apparatus;
   (b) at least one screen fixed inside said peripheral wall and having a surface extending substantially transversely relative to said flow of gas, said screen being provided with passages for the flow of gas and with fins that project from its surface, said screen and said fins being made of refractory sheet material and being at said desired temperature value; and
   (c) a gas-tight base plate supporting said peripheral wall and at least one screen while defining with said peripheral wall a passage for allowing the gas having passed through said screen to flow laterally off the preheating apparatus into said enclosure, said base plate allowing the preheating apparatus to be supported on top of substrates inside the enclosure, whereby the gas flowing through said channel is preheated by contacting said screen and said fins before flowing out of the preheating apparatus.

7. An installation as claimed in claim 6, wherein said support means for supporting said substrates inside the enclosure and said screen and projecting fins are rotatable, whereby the reactive gas fed to the enclosure can be forced to enter the preheating apparatus by being sucked by the assembly of said screen and projecting fins rotating with said support means.

* * * * *

UNITED STATES PATENT AND TRADEMARK OFFICE
CERTIFICATE OF CORRECTION

PATENT NO. : 5,362,228
DATED : November 8, 1994
INVENTOR(S) : Serge Vaudel

It is certified that error appears in the above-indentified patent and that said Letters Patent is hereby corrected as shown below:

Column 2, line 8, "pans" should read --parts--.

Column 2, line 14, "pans" should read --parts--.

Column 3, line 22, "pans" should read --parts--.

Signed and Sealed this

Twelfth Day of September, 1995

Attest:

BRUCE LEHMAN

Attesting Officer        Commissioner of Patents and Trademarks